United States Patent
Wu et al.

(10) Patent No.: US 8,367,516 B2
(45) Date of Patent: Feb. 5, 2013

(54) LASER BONDING FOR STACKING SEMICONDUCTOR SUBSTRATES

(75) Inventors: Ting-Hau Wu, Yilan (TW); Chun-Ren Cheng, Hsin-Chu (TW); Jiou-Kang Lee, Zhu-Bei (TW); Shang-Ying Tsai, Jhongli (TW); Jung-Huei Peng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 714 days.

(21) Appl. No.: 12/618,477

(22) Filed: Nov. 13, 2009

(65) Prior Publication Data

US 2010/0178732 A1 Jul. 15, 2010

Related U.S. Application Data

(60) Provisional application No. 61/144,668, filed on Jan. 14, 2009.

(51) Int. Cl.
*H01L 21/30* (2006.01)

(52) U.S. Cl. .......................... 438/455; 438/109

(58) Field of Classification Search .......... 438/108, 438/109, 455, 456, 457, 459, 464; 257/621
See application file for complete search history.

(56) References Cited

U.S. PATENT DOCUMENTS

| | | | |
|---|---|---|---|
| 4,814,855 A | 3/1989 | Hodgson et al. | |
| 5,650,881 A | 7/1997 | Hornbeck | |
| 6,423,613 B1 | 7/2002 | Geusic | |
| 6,568,794 B2 | 5/2003 | Yamanaka et al. | |
| 6,630,713 B2 | 10/2003 | Geusic | |
| 6,903,442 B2 * | 6/2005 | Wood et al. | 257/621 |
| 7,167,298 B2 | 1/2007 | Pan | |
| 7,307,777 B2 | 12/2007 | Pan | |
| 7,346,178 B2 | 3/2008 | Zhe et al. | |
| 2005/0127478 A1 * | 6/2005 | Hiatt et al. | 257/621 |
| 2006/0199363 A1 * | 9/2006 | Kirby et al. | 438/597 |
| 2007/0045762 A1 | 3/2007 | Nogami et al. | |

* cited by examiner

*Primary Examiner* — Kevin M Picardat
(74) *Attorney, Agent, or Firm* — Slater & Matsil, L.L.P.

(57) ABSTRACT

Methods and structures using laser bonding for stacking semiconductor substrates are described. In one embodiment, a method of forming a semiconductor device includes forming a trench in a first substrate, and a bond pad on a second substrate comprising active circuitry. A top surface of the bond pad includes a first material. The first substrate is aligned over the second substrate to align the trench over the bond pad. An electromagnetic beam is directed into the trench to form a bond between the first material on the bond pad and a second material at a bottom surface of the first substrate.

24 Claims, 7 Drawing Sheets

LASER BONDING FOR STACKING SEMICONDUCTOR SUBSTRATES

This application claims the benefit of U.S. Provisional Application No. 61/144,668 filed on Jan. 14, 2009, entitled "Laser Bonding for Stacking Semiconductor Substrates," which application is hereby incorporated herein by reference.

TECHNICAL FIELD

The present invention relates generally to bonding, and more particularly to bonding for stacking semiconductor substrates using laser annealing.

BACKGROUND

One of the goals in the fabrication of electronic components is to minimize the size of various components. For example, it is desirable that handheld devices such as cellular telephones and personal digital assistants (PDAs) be as small as possible. To achieve this goal, the semiconductor circuits that are included within the devices should be as small as possible. One way of making these circuits smaller is to stack the chips that carry the circuits.

A number of ways of interconnecting the chips within the stack are known. For example, bond pads formed at the surface of each chip can be wire-bonded, either to a common substrate or to other chips in the stack. Another example is a so-called micro-bump 3D package, where each chip includes a number of micro-bumps that are routed to a circuit board, e.g., along an outer edge of the chip. However, introduction of such interconnects may introduce additional challenges.

The integration of chips brings-forth a number of new challenges that need to be addressed. One of the challenges arises due to heating required to form an adhesive bond between the two chips or between a chip and a substrate. Problems due to heating include wafer bowing as well melting of critical components within the chips. These challenges increase dramatically as the diameter of the wafer increases. Hence, what is needed in the art are improved structures and methods of producing structures for chip bonding that overcome these and other challenges.

SUMMARY

These and other problems are generally solved or circumvented, and technical advantages are generally achieved, by preferred embodiments of the present invention.

Embodiments of the invention include laser bonding. In accordance with a preferred embodiment of the present invention, a method for forming a semiconductor device comprises forming a trench in a first substrate. The method further comprises forming a bond pad on a second substrate comprising active circuitry, a top surface of the bond pad comprising a first material. The trench is aligned over the bond pad by aligning the first substrate over the second substrate. A bond between the first material on the bond pad and a second material at a bottom surface of the first substrate is formed by directing an electromagnetic beam into the trench.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes

FIG. 3, which includes

FIG. 4, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Conventional bonding techniques use a wafer level heating technique that requires heating the entire wafer in a furnace. This results in unwanted heating of other sensitive components within the wafer resulting in deleterious effects to these sensitive components. For example, due to mismatch in coefficient of thermal expansion between various layers, the wafer warps. Increase in wafer warpage or wafer bowing may result in misalignment of the wafer with tools used in subsequent processing or testing. Other problems arising from increased heating of sensitive components include cracking of sensitive layers, formation of bubbles and/or residue, as well as deterioration of active devices due to boron penetration and/or dopant deactivation.

However, bonding techniques frequently require a minimum temperature for forming the adhesive layer that also forms the conductive bond. In various embodiments, embodiments of the present invention overcome these limitations by using a local heating technique that allows heating the regions that are being bonded without substantially heating the sensitive components.

The present invention will be described with respect to preferred embodiments in a specific context, namely a eutectic laser bonding technique for coupling two substrates. The invention may also be applied, however, to other bonding processes that require heating as well as to bonding individual components such as diced wafers.

A structural embodiment will be described using FIG. 1. An embodiment of a method of fabricating a stacked chip will be described in FIG. 2. Additional embodiments of fabrication are described with respect to FIGS. 3 and 4. Another structural embodiment including wire bonding techniques will be described using FIG. 5.

Figure 1:
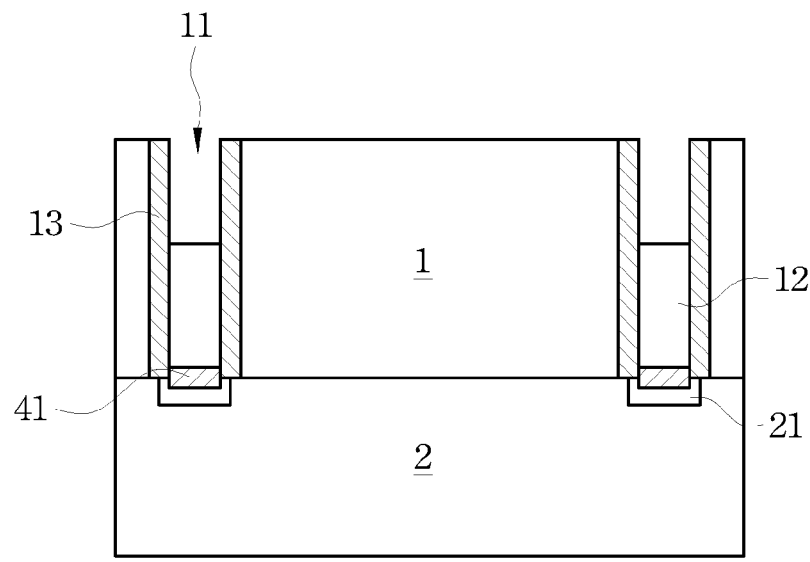
FIG. 1 is a structural embodiment of a semiconductor device formed in accordance with embodiments of the invention.

FIG. 1 is a structural embodiment of a semiconductor device formed in accordance with embodiments of the invention.

A first substrate 1 is stacked over a second substrate 2. The second substrate 2 comprises devices such as micro electromechanical devices and/or electrical devices. The first substrate 1 comprises a silicon substrate, a germanium substrate, or other compound semiconductor substrates.

Through substrate trenches 11 are disposed in the first substrate 1. The through substrate trenches 11 are disposed over the bond pads 21 of the second substrate 2. The bond pads 21 are electrically coupled to the devices in the second substrate 2. The bond pads 21 comprise a first material. The first material comprises Au, Ag, Sn, Pb, and/or Al as examples. The bond pads 21 are electrically coupled to a second material 12 disposed within the through substrate trenches 11. The second material 12 comprises Au, Ag, Sn, Pb, Al, Si, Ge, as examples. The bond pads are physically coupled to the second material 12 through a eutectic alloy region 41. The eutectic alloy region 41 is disposed between the second material 12 and the bond pads 21. The eutectic alloy region 41 comprises a eutectic alloy of the first material and the second material 12. For example, the eutectic alloy region 41 comprises a eutectic comprising Au/Si, Au/Ge, Sn/Pb, Ag/Si, Ag/Ge, or combinations thereof. In some embodiments, an optional liner 13 is disposed between the second material 12 and the first substrate 1. The liner 13 comprises a barrier layer such as TiN or TaN.

FIG. 2, which includes FIGS. 2a-2f, illustrates a method of fabricating a stacked substrate by local bonding in accordance with embodiments of the invention.

Figure 2A:
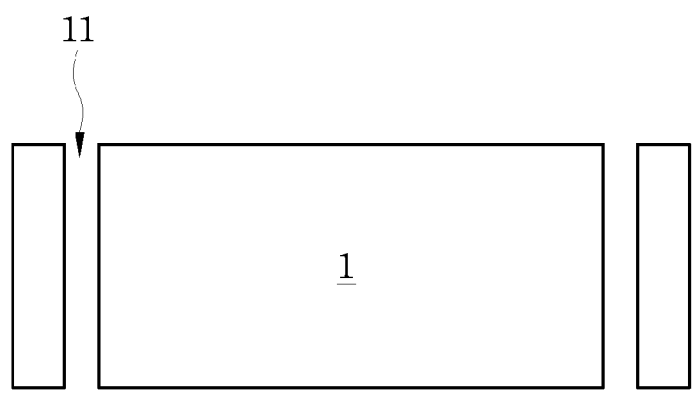
FIGS. 2a-2f, illustrates a semiconductor device in various stages of fabrication in accordance with an embodiment of the invention.
Figure 2A:
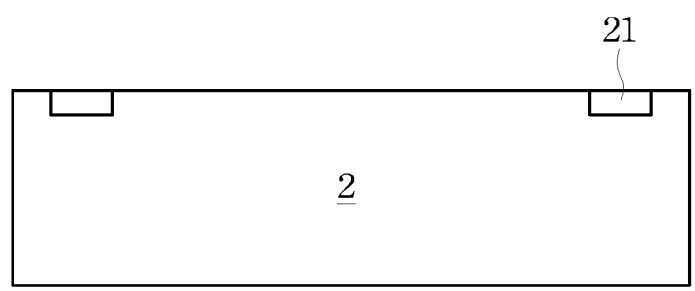

Referring to FIG. 2a, a first substrate 1 and a second substrate 2 are independently fabricated. The second substrate 2 includes electrical circuitry and includes electrical devices such as transistors, diodes, capacitors, etc. as well as electromechanical structures and devices. For example, in one embodiment, the second substrate 2 comprises micro electro mechanical systems (MEMS) devices, while in another embodiment, the second substrate 2 comprises MOS devices.

In one embodiment, the first substrate 1 comprises a silicon or germanium substrate with no active circuitry or devices disposed within it. In such an embodiment, the first substrate 1 is a carrier or substrate to hold the second substrate 2. Alternately, in another embodiment, the first substrate 1 comprises active circuitry or devices.

Referring to FIG. 2a, a through substrate trench 11 is fabricated in the first substrate 1. The through substrate trench 11 extends from the top surface to an opposite bottom surface of the first substrate 1. The through substrate trench 11 is fabricated using, for example, a reactive ion etcher, in one embodiment.

The second substrate 2 comprises bond pads 21 that are electrically coupled to the electrical circuitry of the second substrate 2. The top surface of the bond pads 21 are coated with a first material, for example, by depositing the first material using a subtractive patterning process. For example, a blanket layer of the first material is deposited over the second substrate 2, followed by selective removal of the first material by using a photo lithographic process. Alternately, the first material is a part of the bond pad, for example, part of a top metal level.

In various embodiments, the first material on the bond pads 21 of the second substrate 2 comprises gold, silver, tin, lead, aluminum, or combinations thereof. In various embodiments, the through substrate trench 11 comprises a dimension similar to the bond pads 21 of the second substrate 2. In one embodiment, a maximum dimension of the through substrate trench 11 is smaller than the maximum dimension of the bond pads 21 by at least 20%.

Figure 2B:
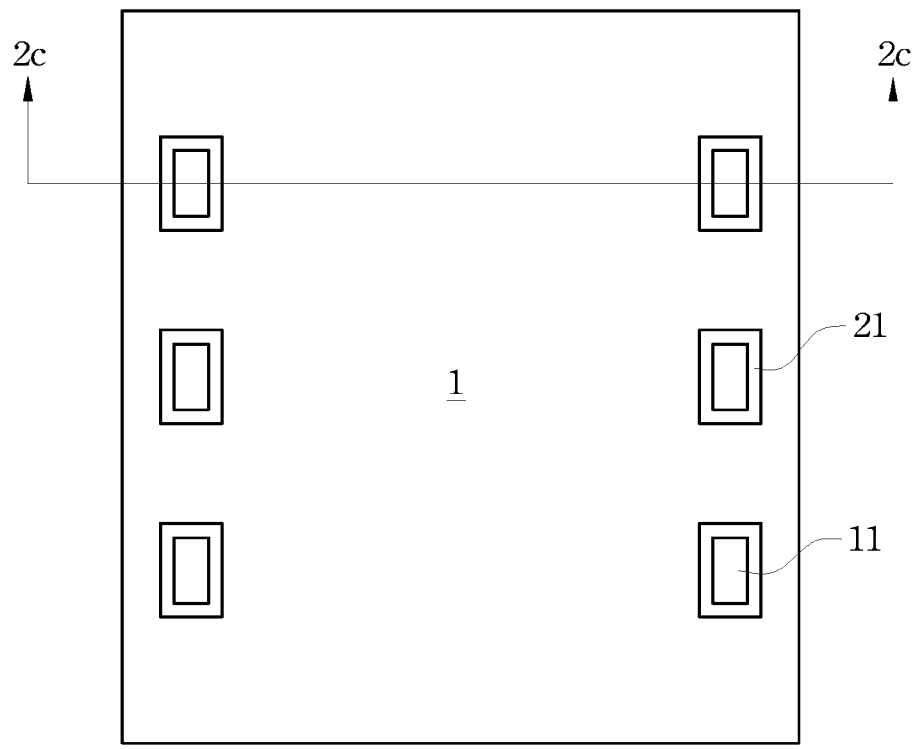
Figure 2C:
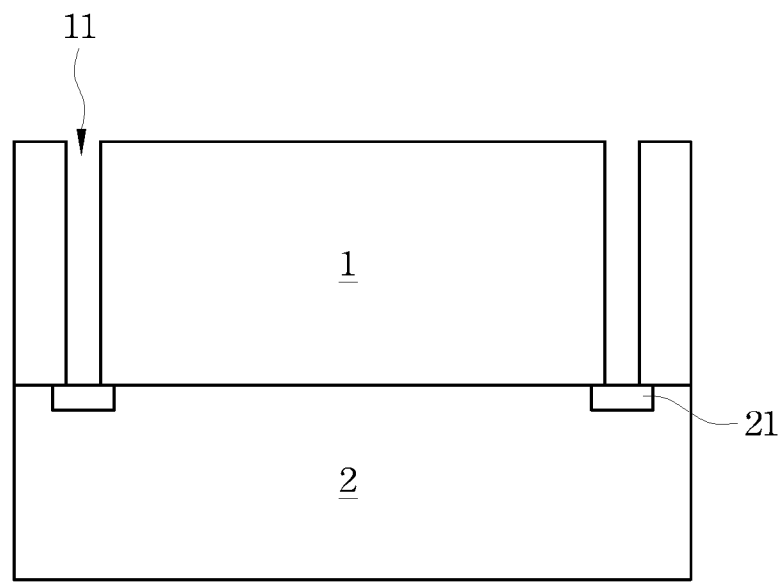
Figure 2D:
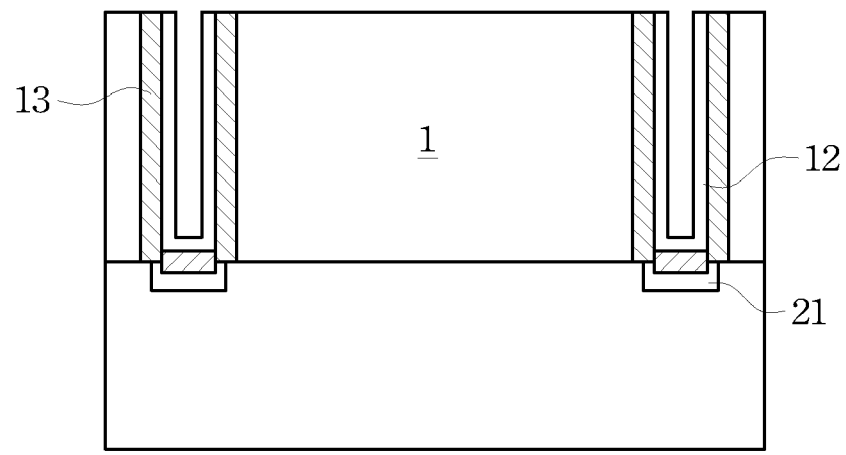

Referring to FIGS. 2c and 2d, the first substrate 1 is aligned with the second substrate 2, and stacked. FIG. 2c illustrates a cross sectional view and FIG. 2b illustrates a top view of the stacked substrates. The first substrate 1 and the second substrate 2 are aligned such that the through substrate trenches 11 are aligned with respect to the bond pads 21.

Referring next to FIG. 2d, a second material 12 is deposited into the through substrate trenches 11. The second material 12 comprises gold, silver, tin, lead, or combinations thereof such that the first material on the bond pads 21 and the second material 12 are capable of forming an eutectic alloy. In various embodiments, examples of eutectic alloys include Au—Si, Au—Ge, Al—Si, Al—Ge, Sn—Pb, or combinations thereof.

A liner 13 is optionally formed prior to depositing the second material to protect the first substrate 1, and prevent out-diffusion of the second material 12 into the first substrate 1. The optional liner 13 is deposited and etched to form a spacer. In various embodiments, the liner 13 is formed before or after aligning the first substrate 1 with the second substrate 2. The liner 13 comprises a conductive material such as TiN, or TaN, and preferably materials that are inert with respect to the first material and/or second material 12.

Figure 2E:
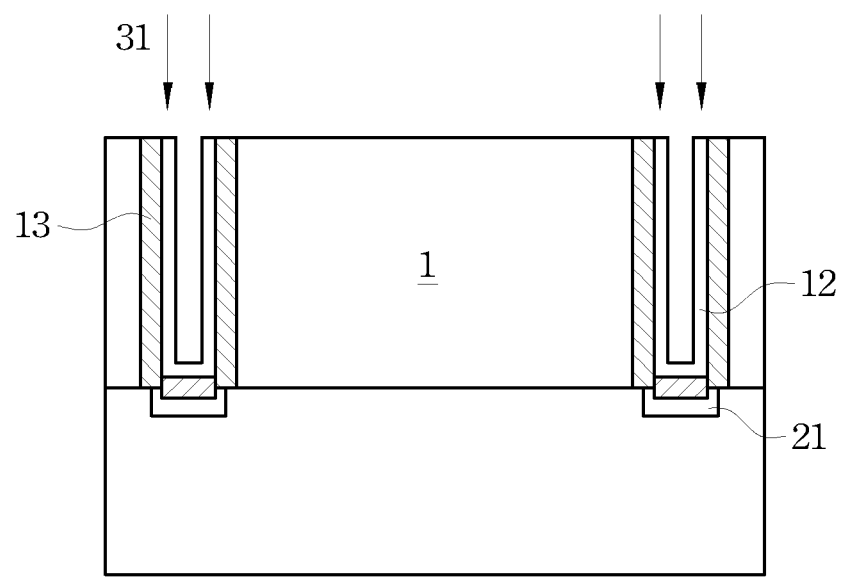

The stacked substrates are locally heated using a laser source as illustrated in FIG. 2e. A laser spot beam 31 is moved over the wafer over the through substrate trenches 11. The laser spot beam 31 is moved along a row thereby heating the first substrate only along a rectangular area with a width defined by the spot beam width. Hence, in this embodiment, regions of the first substrate 1 between adjacent through substrate trenches 11 is not heated unless they are in the direction of the movement of the laser spot beam 31.

Alternately in another embodiment, the laser is pulsed so that the laser spot beam 31 is activated only when the laser spot beam 31 is over the through substrate trenches 11. Thus, even along the direction of movement of the laser spot beam 31, the regions of the first substrate 1 between adjacent through substrate trenches 11 are not heated.

In various embodiments, the power density, scan speed, and beam width of the laser spot beam 31 are selected such that the through substrate trenches 11 are locally heated up to over its eutectic temperature. For example, the through substrate trenches 11 are heated to about 365° C. for joining using a Si/Au eutectic mixture and 420° C. for joining using a Ge/Al eutectic mixture. The laser scan speed can be controlled and, in one embodiment is greater than about 100 mm/sec. In various embodiments, the laser wavelength depends on its source, which can be about 0.3 nm (X-ray), 405 nm (Blue ray) to about 648 nm (red laser).

In some embodiments, other electromagnetic radiation may be used, for example, electro magnetic radiation that is incoherent. Alternately, in some embodiments, other radiation such as ionic radiation may be used as the heating beam. Any source of energy may be used as a heating source if it can be focused into the required area and imparts the energy to the substrate.

Figure 2F:
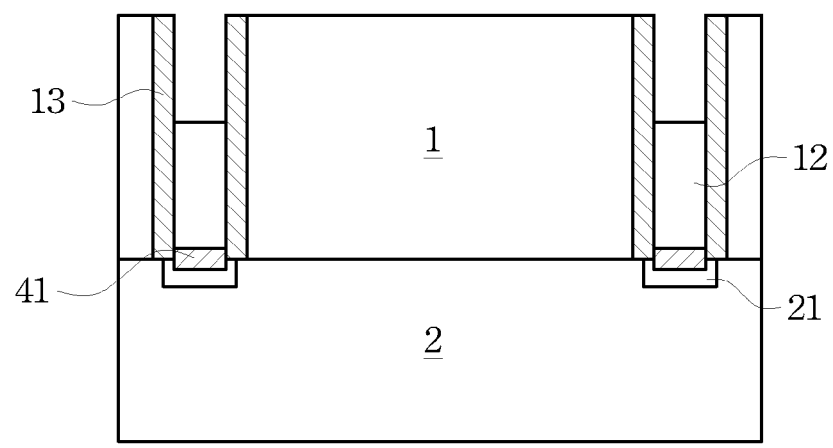

In the through substrate trenches 11, the first material and the second material are locally melted and form an eutectic alloy region 41 that bonds the first substrate 1 to the bond pads 21 of the second substrate 2 (FIG. 2f). Subsequent processing continues using conventional processing. For example, the second substrate 2 may be thinned from the back side by grinding/etching processes, and a protective fill material formed over the stacked substrates.

Figure 3A:
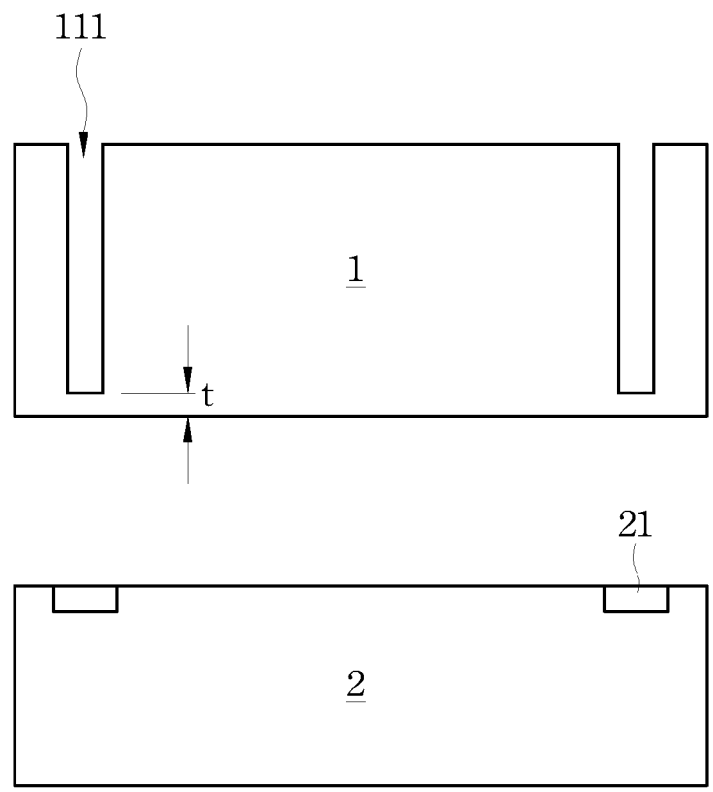
FIGS. 3a-3c, illustrates a semiconductor device in various stages of fabrication in accordance with an embodiment of the invention.
Figure 3B:
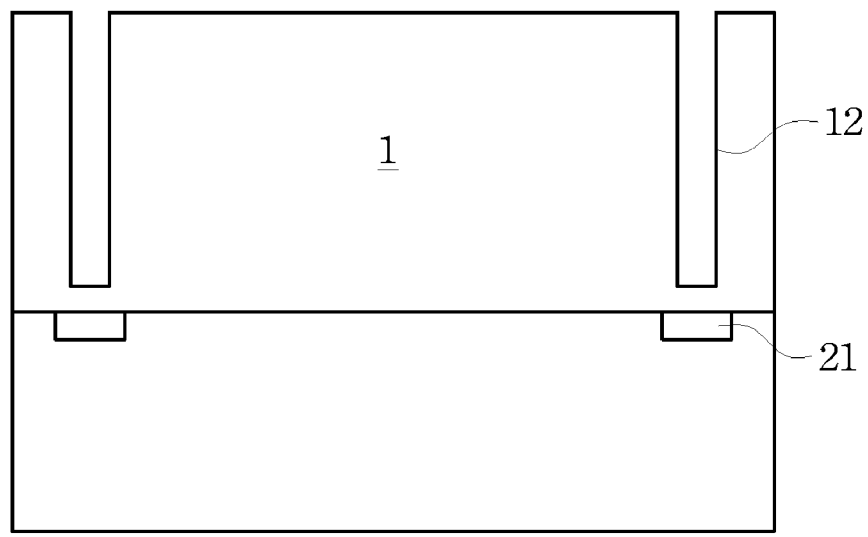
Figure 3C:
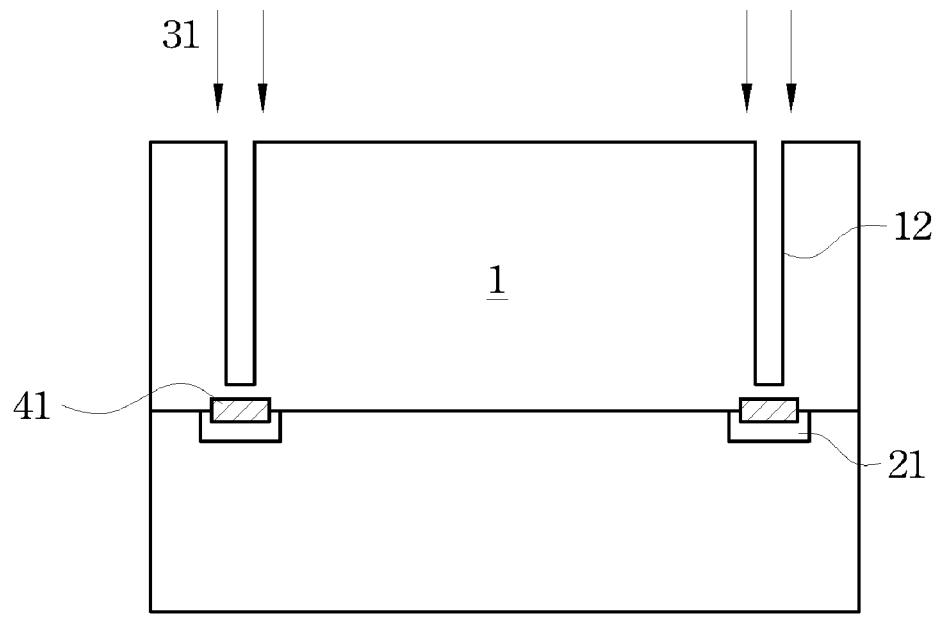

FIG. 3, which includes FIGS. 3a-3c, illustrates an embodiment of the invention wherein the trenches are not formed as through substrate openings.

Referring to FIG. 3a, a trench 111 is formed within the first substrate 1. Unlike the through substrate trenches 11 (e.g. FIG. 2a), the trench 111 does not extend from the top surface to the bottom surface of the first substrate 1. However, only a small layer of the first substrate 1 comprising a thickness t is disposed underneath the trench 111. The thickness t in various embodiments varies from about 10 nm to about 100 nm. The trench 111 is aligned with the bond pads 21 of the second substrate 2 as in prior embodiment (FIG. 3b). The trench 111 is heated locally using a laser spot beam forming the eutectic alloy region 41 that bonds the first substrate 1 with the second substrate 2 (FIG. 3c).

The first substrate 1 comprises a doped substrate such that the layer of first substrate 1 with the thickness t does not increase the contact resistance to the bond pads 21 through the trenches 111. Additionally, a low energy implant (e.g., B<1000 eV, As<2 keV) is performed to dope the bottom surface of the trench 111 with a conductive material. In one embodiment, the implant is performed before heating with the laser spot beam.

Figure 4A:
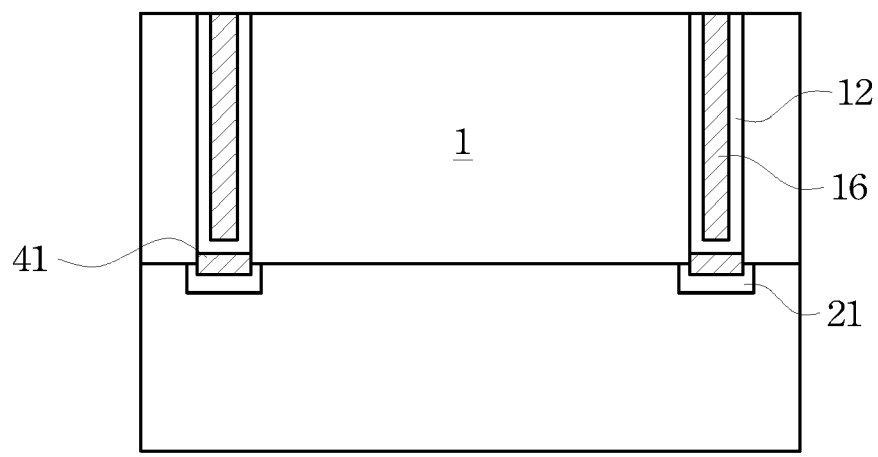
FIGS. 4a and 4b, illustrates a semiconductor device in various stages of fabrication in accordance with an embodiment of the invention.
Figure 4B:
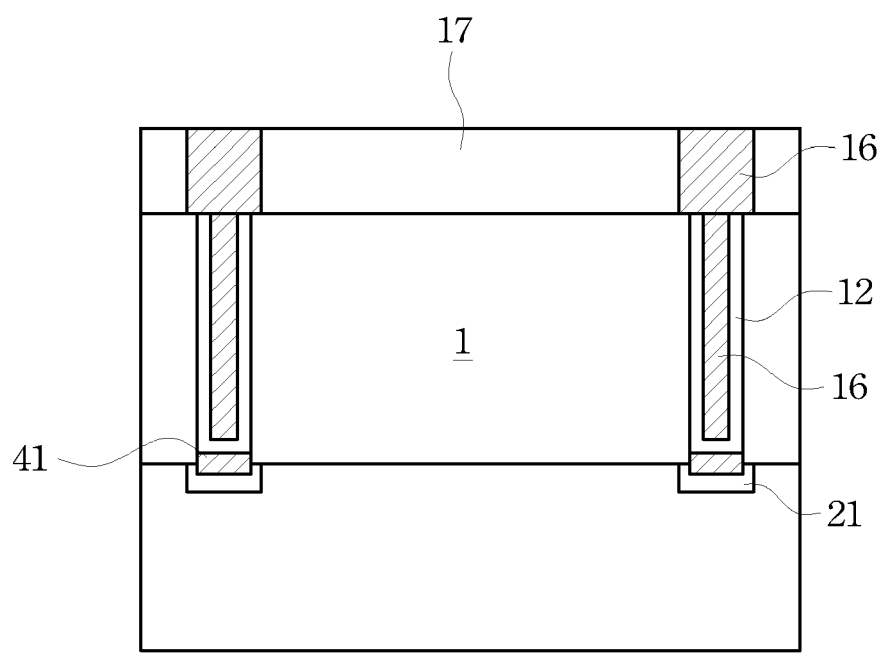

FIG. 4, which includes FIGS. 4a and 4b, illustrates an embodiment of the invention using heat absorbing materials.

FIG. 4 illustrates an additional step relative to the prior embodiments of FIGS. 2 and 3. FIG. 4, unlike the prior embodiments, uses an additional heat absorbing material to concentrate or further localize the heating to a smaller zone around the bond pads 21 of the second substrate 2. By using an absorbing layer, the area of the trench is preferentially heated relative to the rest of the substrate minimizing the heat transferred to the second substrate 2. In some embodiments, the absorbing layer may be used if the trench material reflects a substantial portion of the impinging laser energy.

FIG. 4a illustrates an embodiment wherein a heat absorber layer 16 fills the through substrate trench 11. Alternately, the heat absorber layer 16 may not fill the through substrate trench 11. The heat absorber layer 16 helps to absorb more of the radiation locally over the through substrate trench 11. The heat absorber layer 16 is preferably formed over the through substrate trench 11 by filling the voids of the through substrate trench 11 (FIG. 4a), or patterned as in FIG. 4b.

FIG. 4b shows the heat absorber layer 16 formed by patterning a non heat absorbing material 17. The local presence of heat absorber layer 16 enables the use of a lower power laser source or alternately a faster laser scan speed due to improved efficiency of the heat transfer process. The heat absorber layer 16 substantially absorbs any laser radiation impacting it. The layer reflects little if any of the electromagnetic radiation emitted by the laser. In various embodiments, the heat absorber layer 16 comprises amorphous carbon including amorphous carbon doped with impurities such as nitrogen, phosphorus, fluorine, oxygen, or combinations thereof.

For example, using the heat absorber layer 16 of this embodiment, the laser spot beam may be directly along a continuous line (continuous line scan) rather than pulsing the laser. In some embodiments, pulsing the laser may be not be preferable due to misalignment issues because the laser spot beam needs to be turned on accurately when the laser spot beam is over the through substrate trench 11.

Figure 5:
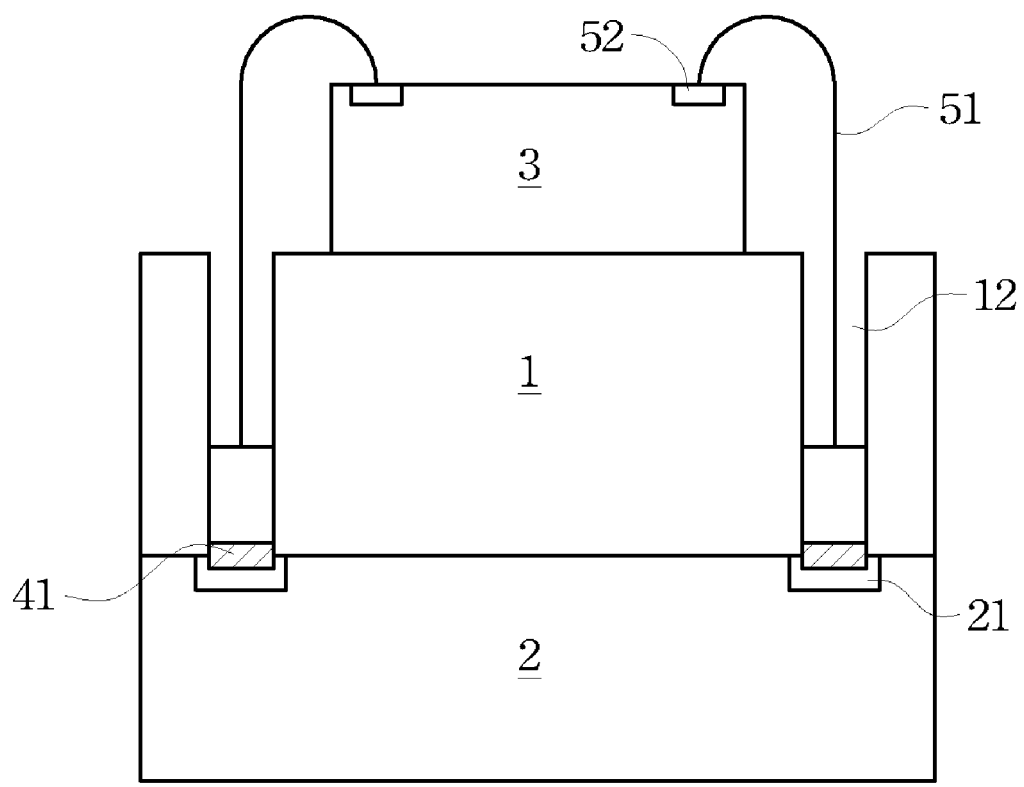
FIG. 5 is a structural embodiment of a semiconductor device formed in accordance with an embodiment of the invention.

FIG. 5 illustrates an embodiment showing a third substrate 3 stacked over the stacked substrates, e.g., of FIG. 2 or FIG. 3.

A third substrate 3 is stacked over the first substrate 1. The third substrate 3 comprises electrical circuitry and includes electrical, and/or electro-mechanical devices. The third substrate 3 is coupled electrically to the second substrate 2 through the through substrate trenches 11 (or trench 111 of FIG. 3), for example, using wire bonds 51. The wire bonds 51 couple the pads 52 on the third substrate 3 to the bond pads 21 on the second substrate 2.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   forming a trench in a first substrate;
   forming a bond pad on a second substrate comprising active circuitry, a top surface of the bond pad comprising a first material;
   aligning the first substrate over the second substrate, wherein the trench is aligned over the bond pad; and
   directing a radiative beam into the trench to form a bond between the first material on the bond pad and a second material at a bottom surface of the first substrate.

2. The method of claim 1, wherein the first material is selected from the group consisting of gold, silver, aluminum, tin, and lead.

3. The method of claim 1, wherein the second material comprises silicon or germanium.

4. The method of claim 1, wherein forming the bond comprises forming a eutectic alloy of the first material and the second material.

5. The method of claim 1, further comprising depositing the second material into the trench, wherein the trench comprises a through substrate trench.

6. The method of claim 5, wherein the second material is selected from the group consisting of silicon, germanium, gold, silver, aluminum, tin, and lead.

7. The method of claim 1, wherein the bond between the first material on the bond pad and the second material on the first substrate is electrically conductive.

8. The method of claim 1, further comprising depositing a heat absorbing material over the trench before directing the radiative beam.

9. The method of claim 8, wherein the heat absorbing material comprises carbon.

10. The method of claim 1, wherein the first substrate comprises a semiconductor wafer with electrical circuitry.

11. The method of claim 1, further comprising stacking a third substrate over the first substrate, and electrically coupling the third substrate to the second substrate through the trench and the bond pad, wherein the third substrate comprises electrical circuitry.

12. The method of claim 11, wherein the electrical coupling uses wire bonds.

13. The method of claim 1, wherein the radiative beam comprises an electromagnetic beam.

14. The method of claim 1, wherein the radiative beam comprises an electromagnetic laser beam.

15. The method of claim 14, wherein a wavelength of the laser beam is less than about 648 nm, and wherein the speed of the laser beam relative to the first substrate is greater than about 100 mm/sec.

16. The method of claim 1, wherein the radiative beam is not directed between adjacent trenches of the first substrate.

17. A method of forming a semiconductor device, the method comprising:
forming a first row and a second row of vias in a first substrate;
forming first and a second row of bond pads on a second substrate comprising active circuitry;
aligning the first substrate over the second substrate, wherein the first row of vias are aligned over the first row of bond pads, and wherein the second row of vias are aligned over the second row of bond pads; and
directing a photon beam over the first and second rows of vias to form a conductive bond between a first material on the bond pads and a second material at a bottom surface of the first row and the second row of vias.

18. The method of claim 17, further comprising depositing the second material into the first and the second rows of vias, wherein the first and the second rows of vias comprise through substrate vias.

19. The method of claim 18, further comprising depositing a heat absorbing material over the first and the second rows of vias, the heat absorbing material being disposed over the second material before directing the photon beam.

20. The method of claim 17, wherein the photon beam is a laser beam.

21. The method of claim 20, wherein a wavelength of the laser beam is less than about 648 nm, and wherein the speed of the laser beam relative to the first substrate is greater than about 100 mm/sec.

22. The method of claim 20, wherein a spot beam width of the laser beam is less than the distance between the first row of vias and the second row of vias.

23. The method of claim 20, wherein the laser beam is sequentially scanned over the first row of vias and then over the second row of vias.

24. The method of claim 17, wherein the photon beam is not directed between adjacent vias of the first substrate.

\* \* \* \* \*